United States Patent [19]

Remedi et al.

[11] Patent Number: 4,511,914
[45] Date of Patent: Apr. 16, 1985

[54] POWER BUS ROUTING FOR PROVIDING NOISE ISOLATION IN GATE ARRAYS

[75] Inventors: James J. Remedi, Austin; Don G. Reid, Round Rock; Lynette Ure, Austin, all of Tex.

[73] Assignee: Motorola, Inc., Schaumburg, Ill.

[21] Appl. No.: 394,239

[22] Filed: Jul. 1, 1982

[51] Int. Cl.³ .................. H01L 27/02; H01L 27/10; H01L 23/48; H01L 27/15
[52] U.S. Cl. ........................ 357/45; 357/41; 357/68
[58] Field of Search ................. 357/68, 45, 41

[56] References Cited

U.S. PATENT DOCUMENTS

| | | | |
|---|---|---|---|
| 3,808,475 | 4/1974 | Buelow et al. | 357/68 |
| 3,999,214 | 12/1976 | Cass | 357/45 |
| 4,161,662 | 7/1979 | Malcolm et al. | 357/45 |
| 4,212,026 | 7/1980 | Balasubramanian et al. | 357/68 |
| 4,218,693 | 8/1980 | Gee et al. | 357/45 |
| 4,249,193 | 2/1981 | Balyoz et al. | 357/68 |
| 4,393,464 | 7/1983 | Knapp et al. | 357/45 |
| 4,412,237 | 10/1983 | Matsumura et al. | 357/41 |

FOREIGN PATENT DOCUMENTS

| | | | |
|---|---|---|---|
| 55-82448 | 6/1980 | Japan | 357/45 |
| 57-100747 | 6/1982 | Japan | 357/45 |

Primary Examiner—Martin H. Edlow
Assistant Examiner—Jerome Jackson
Attorney, Agent, or Firm—Anthony J. Sarli, Jr.; Jeffrey Van Myers; Robert Lee King

[57] ABSTRACT

A gate array which has power bus routing for increasing current availability to a plurality of transistor cells is provided. The gate array also has separate power busses for input/internal logic and output circuits. The gate array comprises n columns of transistor cells with two power busses extending substantially along each column to power the cells. Input/internal logic power busses and separate output power busses extend around the perimeter of the columns of transistor cells. At least one power strip for increasing current availability to the transistor cells is routed across the transistor cells substantially perpendicular to the n columns and is connected to both the power busses of each column and to the input/internal logic power busses.

9 Claims, 1 Drawing Figure

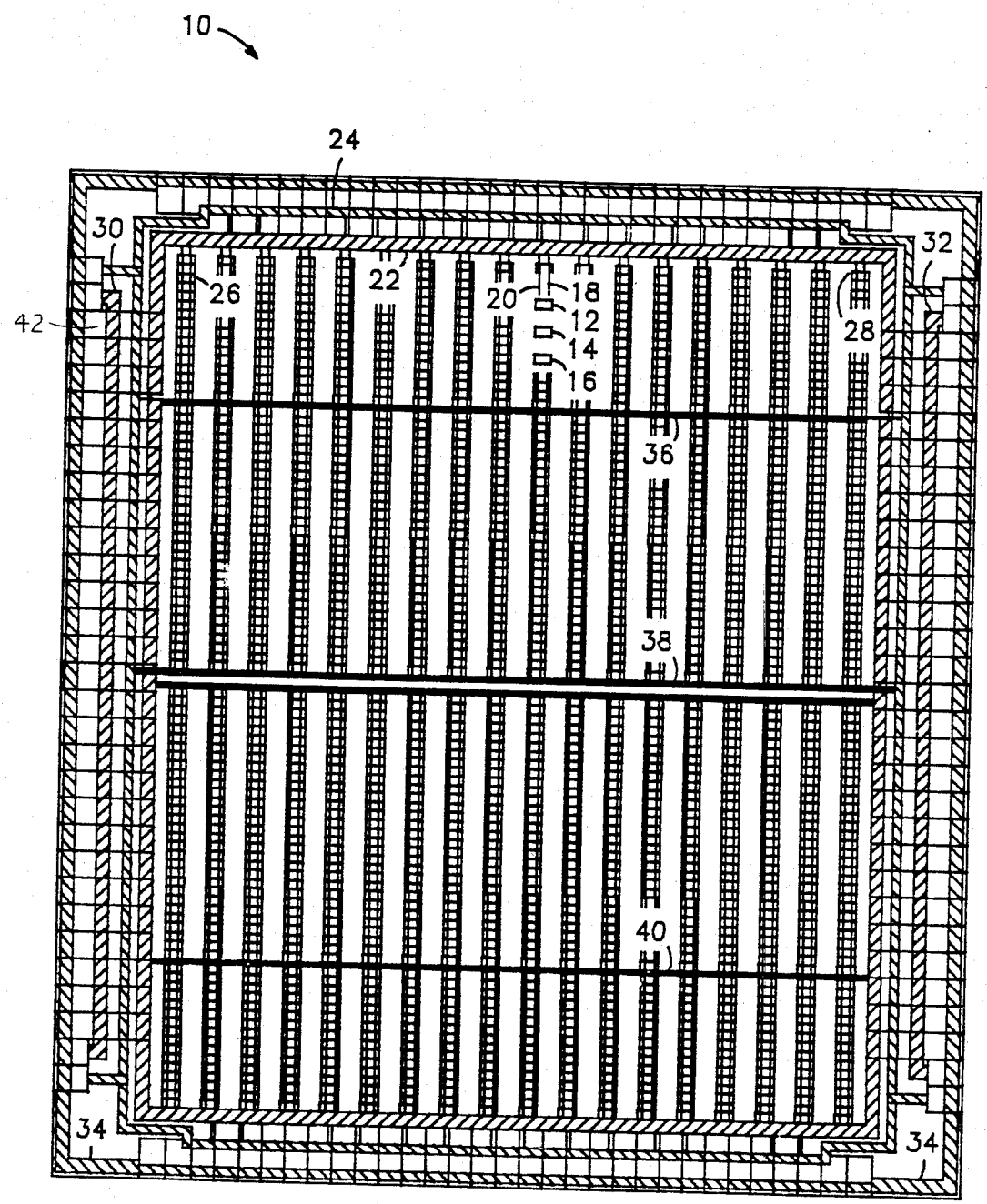

POWER BUS ROUTING FOR PROVIDING NOISE ISOLATION IN GATE ARRAYS

TECHNICAL FIELD

This invention relates generally to gate arrays, and, more particularly, to power bus routing for gate arrays.

BACKGROUND ART

Gate arrays are uniform patterns of hundreds or thousands of unconnected transistor-level gate cells. Due to the availability to a designer of means to connect the cells via interlevel contacts and interlevel routing performed at a late stage in processing, many custom circuits may be created from a basic gate array. A basic design objective of gate arrays is to make the gate cells easily accessible to power and ground busses since the gate cells are typically placed on a level different from the power and ground busses. However, when hundreds or thousands of transistors are connected in an array, very large current spikes may develop in certain locations of the array when the transistors switch at the same time. When power busses are not routed closely to the transistors, noise may exist on internal nodes and create logic errors in the gate array cells. When current spikes exist at the inputs of the gate array, these spikes may also create logic errors in the internal portion of the gate array. Some gate arrays utilize separate digital and analog power and ground distribution busses to minimize analog circuit noise from digital circuitry as noted on page 166 of "CMOS Uncommitted Logic Arrays Are Part-Digital, Part-Analog", by Yoder, *Electronics*, Jan. 13, 1981. However, when such gate arrays have a large plurality of input/output cells per side of the array, large current spikes at the output may still generate noise errors in the internal digital circuitry.

BRIEF SUMMARY OF THE INVENTION

It is an object of the present invention to provide a gate array having improved power bus routing.

Another object of the present invention is to increase current availability to transistor cells in a gate array without substantially modifying existing power bus routing.

Another object of the present invention is to provide an improved gate array which reduces noise present in internal circuitry and which reduces the presence of current spikes from transistor switching.

Yet another object of the present invention is to provide an improved gate array which isolates noise at the input/output cells from the internal circuitry.

In carrying out the above and other objects and advantages of the present invention, there is provided, in one form, a gate array having n parallel columns of a plurality of transistor cells, where n is an integer. Each column, in the preferred form, has first and second power busses which extend from end to end of the column and which provide power to the transistor cells. The first and second power busses are coupled to first and second voltage potential lines. A pair of output power busses are positioned parallel to an outer side of both a first and an nth column of the n columns. Each pair of output power busses is substantially parallel to said n columns and coupled to the first and second voltage potential lines. Separate power busses in the form of first and second input/internal logic power busses extend substantially around the perimeter of said n columns and between the n columns and the output power busses. Additionally, at least one power strip extends substantially perpendicular to said n columns to connect input/internal power busses with the first and second power busses of each column to provide increased current availability to the transistor cells. The above and other objects, features and advantages of the present invention will be more clearly understood from the following detailed description taken in conjunction with the accompanying drawing.

BRIEF DESCRIPTION OF THE DRAWING

The single FIGURE illustrates in graphic form a gate array constructed in accordance with a preferred embodiment of the present invention.

DESCRIPTION OF THE PREFERRED EMBODIMENT

Shown in the single drawing is a gate array 10 having n columns of transistor cells, such as column 12 having cells 14 and 16, where n is an integer. Although in a preferred form eighteen columns of transistor cells are shown, any number of columns and cells may be used to practise the invention. If gate array 10 is viewed from the left or right side of the drawing, the columns can be considered as rows. Extending the entire length of each of the n columns are first and second power busses, such as power bus 18 and power bus 20 in column 12. The first and second busses in the n columns are coupled to a first and a second voltage potential line, respectively, by coupling each power bus to either an input/internal logic power bus 22 or an input/internal logic power bus 24. It should be noted that not all gate arrays have a plurality of continuous columns of transistor cells, but rather may have columns of cells divided into two or more sections. For gate arrays having sectioned columns of transistor cells, power busses, such as power busses 18 and 20 may not extend the entire length of each column across the plural sections. However, this invention may be practised for gate arrays having any variety of structural organization of transistor cells. In a preferred form, input/internal logic power bus 22 is at a $V_{SS}$ potential and extends substantially around the perimeter of the n columns. Input/internal logic power bus 24 is at a $V_{DD}$ potential and also extends substantially around the perimeter of the n columns in a preferred form. Conventionally, the $V_{DD}$ potential is a positive voltage potential and the $V_{SS}$ potential is more negative than $V_{DD}$ although $V_{DD}$ is not necessarily a positive voltage potential. Although input/internal logic power busses 22 and 24 encircle the n columns for noise reduction purposes, the input/internal logic power busses need only to be long enough to be physically connected to each pair of power busses of the n columns. On the outer sides of a first column 26 and an nth column 28 are output power busses 30 and 32, respectively, which are coupled to voltage potential $V_{DD}$. Extending around the outside perimeter of gate array 10 is an output power bus 34 which is coupled to $V_{SS}$ potential. The output power busses are so designated because they primarily supply power to output circuits. Output power busses 30 and 34 form a first pair of output busses which, in a preferred form, extend substantially parallel to and along the outside edge of first column 26. Similarly, output power busses 32 and 34 form a second pair of output busses which extend substantially parallel to and along the outside edge of nth column 28 in a preferred form. In yet another form of the invention, output power busses 30 and 32 may be extended in part, or substantially around the perimeter of the n columns. Further, output power busses 30 and 32 may extend substantially parallel to output power bus 34 and be connected to function as a single output power bus. Power strips 36, 38 and 40 extend substantially perpendicular to the n columns and are coupled to busses 22 and 24 at each end at the outside edge of columns 26 and 28. Power strips 36, 38 and 40 each comprise first and second conductive busses, the first of which is connected to input/internal logic power bus 22 at the outside edge of columns 26 and 28. The second conductive bus of power strips 36, 38 and 40 is connected to input/internal logic power bus 24 at the outside edge of columns 26 and 28. In the preferred form, the power busses in the n columns, such as power busses 18 and 20, are routed on a first layer of metal which is covered by an insulating dielectric layer. Power strips 36, 38 and 40 are routed on a second layer of metal so that power strips 36, 38 and 40 do not electrically short circuit the transistor cells of the n columns. The conductive busses of strips 36, 38 and 40 which are connected to input/internal logic power bus 22 are also connected to the first power bus of each column, such as power bus 18 in column 12. This connection is made by cutting a hole, or a via, through the dielectric separating the n columns from power strips 36, 38 and 40. The conductive busses of strips 36, 38 and 40 which are connected to internal logic power bus 24 are connected to the second power bus of each column, such as power bus 20 in column 12. In the preferred form, three power strips are utilized and the first and second conductive busses of power strip 38 are made twice as large as the conductive busses of power strips 36 and 40. However, the invention may be practised with one or any plurality of power strips. It should also be noted that power strips 36, 38 and 40 need not necessarily extend across all the columns of gate array 10. Current availability may be increased by using some or all power strips across only a portion of the n columns.

In operation, a gate array, regardless of what type of process is used to manufacture the array, will usually develop very large current spikes when the transistors in the transistor cells switch. An entire column of transistors may switch at the same time and generate current in the hundreds of milliamperes range. Such current spikes can change the internal logic circuitry and create erroneous data. Conventional power bus routing is not sufficient to keep voltage drops in the cells associated with the current spikes from becoming excessive. Furthermore, in gate arrays there are typically a large number of output cells such as output cell 42 on one or more sides of the gate array with each cell having a contact pad. With a large number of output cells existing, the possibility for large AC and DC loads to be applied thereto exists. Therefore to keep current spikes from entering the array matrix, power busses, such as busses 30, 32 and 34, which are separate from the power busses of the internal logic circuitry and input pads, such as busses 22 and 24, may be used for the output circuits.

To substantially reduce the size of current spikes in each column, the effective ohmic length of the power busses of the n columns is reduced by adding power strips 36, 38 and 40 and connecting them to the power busses of the n columns. If power strips 36, 38 and 40 are routed on a different layer of metal and separated from the power busses of the n columns by a dielectric layer, the logic routing of a conventional gate array has not been disrupted. By now it should be appreciated that a gate array having power routing which separates current spikes in the output cells from internal digital logic and input pins and which minimizes current spikes in the digital logic has been provided.

By having input/internal logic power busses which are separate from output power busses, noise external to gate array 10 is effectively isolated. Furthermore, when separate power busses are used in this manner, the busses may be coupled to different leads in an integrated circuit package and different voltage levels applied thereto.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A gate array having power bus routing for providing noise isolation, comprising:

n columns of a plurality of transistor cells, where n is an integer, each of said n columns of transistor cells having first and second power busses extending substantially along each of the n columns and coupled to predetermined ones of the transistor cells;

first and second input/internal power busses coupled to said first and second power busses of each column, respectively, and extending substantially around the perimeter of said n columns, for providing power to each transistor cell of said n columns;

at least one power strip extending substantially perpendicular to said n columns of transistor cells, coupling each of said pair of input/internal power busses to a predetermined one of said first and second power busses of one or more columns, for providing increased current to said plurality of transistor cells; and output power busses positioned along the outer perimeter of said gate array, for providing power busses for output cells along one or more sides of the gate array which are separate from the internal power busses to keep external current spikes from being coupled into the array.

2. The gate array of claim 1 wherein said output power busses further comprise:

a first output power bus positioned completely around the perimeter of the gate array; and second and third output power busses positioned parallel to and between the first output power bus and said first and nth columns, respectively, wherein the first output power bus provides a first voltage potential and said second and third output power busses each provide a second voltage potential.

3. The gate array of claim 1 wherein said first and second power busses of each of said n columns are routed on a first conductive layer and said at least one power strip is routed on a second conductive layer which is separated from said first conductive layer by a dielectric layer.

4. The gate array of claim 1 wherein said at least one power strip comprises three power strips extending substantially perpendicular to said n columns and spaced apart to divide said gate array into four sections of substantially equal area.

5. A gate array having n columns of a plurality of transistor cells, where n is an integer, and a plurality of output cells along one or more sides of the gate array, each of said n columns of transistor cells having first and second power busses coupled to first and second voltage potential lines, respectively, and extending substantially along each of the columns, comprising:
   a power strip extending substantially perpendicular to said n columns, and coupling said first and second power busses to said first and second voltage potential lines, respectively, for providing increased current capability to said plurality of transistor cells; and
   output power busses positioned along an outer perimeter of the gate array, for providing power busses for the output cells which are separate from the first and second voltage potential lines used to provide power to the transistor cells, said output power busses keeping external current spikes from being coupled into the array.

6. The gate array of claim 5 further comprising three power strips extending substantially perpendicular to said n columns from the first to the nth column and spaced a substantially equal distance apart, said second power strip located between said first and third power strips, wherein the width of said second power strip is substantially larger than the width of said first and third power strips.

7. A gate array having improved noise isolation, comprising:
   n columns of a plurality of transistor cells, where n is an integer, each of said n columns of transistor cells having first and second power busses extending substantially along the columns and coupled to first and second voltage potential lines, respectively;
   a plurality of output cells along one or more sides of the gate array, for interfacing between the transistor cells and external circuitry;
   a pair of output power busses positioned on each side of said n columns and extending substantially parallel to said n columns, each pair of output power busses providing power only to the output cells; and
   first and second input/internal power busses coupled to said first and second voltage potentials, respectively, and extending substantially around the perimeter of said n columns and extending between said n columns and said output power busses, for providing power only to the n columns of transistor cells.

8. The gate array of claim 7 wherein one output power bus of both pairs of output power busses which are positioned on each side of said n columns further extends substantially around the perimeter of said n columns.

9. A method of isolating noise from an external source in a gate array having a plurality of transistor cells arranged in n columns, where n is an integer, and having a plurality of output cells along one or more sides of the gate array, each column having first and second power busses extending substantially along each of said columns, comprising the steps of:
   providing a plurality of internal power strips along both ends of said n columns and electrically coupled to the first and second power busses of said n columns, to provide power for only the n columns of transistor cells; and
   providing a plurality of output power strips along the perimeter of the gate array, to provide power for only the output cells.

* * * * *